US006549022B1

United States Patent
Cole, Jr. et al.

(10) Patent No.: US 6,549,022 B1
(45) Date of Patent: Apr. 15, 2003

(54) APPARATUS AND METHOD FOR ANALYZING FUNCTIONAL FAILURES IN INTEGRATED CIRCUITS

(75) Inventors: Edward I. Cole, Jr., Albuquerque, NM (US); Paiboon Tangyunyong, Albuquerque, NM (US); Charles F. Hawkins, Albuquerque, NM (US); Michael R. Bruce, Austin, TX (US); Victoria J. Bruce, Austin, TX (US); Rosalinda M. Ring, Austin, TX (US)

(73) Assignees: Sandia Corporation, Albuquerque, NM (US); Advanced Micro Devices, Inc., Sunnyvale, CA (US)

( * ) Notice: Subject to any disclaimer, the term of this patent is extended or adjusted under 35 U.S.C. 154(b) by 358 days.

(21) Appl. No.: 09/586,505

(22) Filed: Jun. 2, 2000

(51) Int. Cl.$^7$ ................................................ G01R 31/02
(52) U.S. Cl. ..................................... 324/752; 324/765
(58) Field of Search ........................ 324/73.1, 750–752, 324/765, 158.1, 500, 537; 250/234–235, 559.07, 311, 492.2

(56) References Cited

U.S. PATENT DOCUMENTS

| | | | | |
|---|---|---|---|---|
| 4,698,587 A | | 10/1987 | Burns ........................ | 324/73 R |
| 4,761,607 A | * | 8/1988 | Shiragasawa et al. ........ | 324/752 |
| 5,047,713 A | * | 9/1991 | Kirino et al. ................ | 324/752 |
| 5,089,774 A | * | 2/1992 | Nakano ..................... | 250/492.2 |
| 5,422,498 A | | 6/1995 | Nikawa ........................ | 257/48 |
| 5,430,305 A | * | 7/1995 | Cole et al. .............. | 250/559.07 |
| 5,659,244 A | | 8/1997 | Sakaguchi ................ | 324/158.1 |
| 5,708,371 A | | 1/1998 | Koyama ..................... | 324/752 |
| 5,804,980 A | | 9/1998 | Nikawa ........................ | 324/752 |
| 5,844,416 A | * | 12/1998 | Campbell et al. ............ | 324/750 |
| 5,952,837 A | | 9/1999 | Koyama ..................... | 324/752 |
| 6,078,183 A | * | 6/2000 | Cole, Jr. ...................... | 324/752 |
| 6,407,560 B1 | * | 6/2002 | Walraren et al. ............. | 324/752 |

OTHER PUBLICATIONS

T. Koyama, Y. Mashiko, M. Sekine, H. Koyama and K. Horie, "New Non–Bias Optical Beam Induced Current (NB–OBIC) Technique for Evaluation of Al Interconnects," *Proceedings of the International Reliability Physics Symposium*, pp. 228–233, 1995, (No month).

K. Nikawa and S. Inoue, "Various Contrasts Identifiable From the Backside of a Chip by 1.3 μm Laser Beam Scanning and Current Change Imaging," *Proceedings of the 22nd International Symposium for Testing and Failure Analysis*, pp. 387–392, Nov. 18, 1996.

S. Ferrier, "Thermal and Optical Enhancements to Liquid Crystal Hot Spot Detection Methods," *Proceedings of the 23rd International Symposium for Testing and Failure Analysis*, pp. 57–62, Oct. 27, 1997.

K. Nikawa and S. Inoue, "Detection and Characterization of Failures and Defecte in LSI Chips by Optical Beam Induced Resistance Changes (OBIRCH)," Presented at DRIP 97, Berlin, Germany, Sep. 7, 1997.

(List continued on next page.)

Primary Examiner—Kamand Cuneo
Assistant Examiner—Minh N. Tang
(74) Attorney, Agent, or Firm—John P. Hohimer

(57) ABSTRACT

An apparatus and method are presented for identifying and mapping functional failures in an integrated circuit (IC) due to timing errors therein based on the generation of functional failures in the IC. This is done by providing a set of input test vectors to the IC and adjusting one or more: of the IC voltage, temperature or clock frequency; the rate at which the test vectors are provided to the IC; or the power level of a focused laser beam used to probe the IC and produce localized heating which changes the incidence of the functional failures in the IC which can be sensed for locating the IC circuit elements responsible for the functional failures. The present invention has applications for optimizing the design and fabrication of ICs, for failure analysis, and for qualification or validation testing of ICs.

55 Claims, 4 Drawing Sheets

OTHER PUBLICATIONS

K. Nikawa and S. Inoue, "New Capabilities of OBIRCH Method for Fault Localization and Defect Detection," Presented at the Sixth Asian Test Symposium (ATS '97), Akita, Japan, Nov. 17–19, 1997.

E.I. Cole, Jr., P. Tangyunyong and D.L. Barton, "Backside Localization of Open and Shorted IC Interconnections," presented at the 1998 International Reliability Physics Symposium, Reno, Nevada, Mar. 30–Apr. 2, 1998.

D.L. Barton, P. Tangyunyong, J.M. Soden, A.Y. Liang, F.J. Low., A.N. Zaplatin, K. Shivanandan and G. Donohoe, "Infrared Light Emission from Semiconductor Devices," ISTFA, pp. 9–17, 1996. (No month).

M. Paniccia, T. Eiles, V.R.M. Rao and W.M Yee, "Novel Optical Probing Technique for Flip Chip Packaged Microprocessors," ITC, pp. 740–747, 1998. (No month).

* cited by examiner

APPARATUS AND METHOD FOR ANALYZING FUNCTIONAL FAILURES IN INTEGRATED CIRCUITS

CROSS REFERENCE TO RELATED APPLICATIONS

The present invention is related to U.S. patent application Ser. Nos. 09/586,518 and 09/586,572 filed on Jun. 2, 2000.

GOVERNMENT RIGHTS

This invention was made with Government support under Contract No. DEAC04-94AL85000 awarded by the U.S. Department of Energy. The Government has certain rights in the invention.

FIELD OF THE INVENTION

The present invention relates generally to failure analysis and qualification testing of integrated circuits (ICs), and specifically to an apparatus and method for analyzing and visualizing functional failures in an IC. These functional failures result from timing errors in the IC which lead to errors in output states of the IC. The apparatus and method of the present invention can be used to locate any circuit elements in the IC that are responsible for producing functional failures therein.

BACKGROUND OF THE INVENTION

Functional failures in an integrated circuit (IC) can arise when information traveling along a particular path in the IC (termed herein a critical timing path) is advanced or delayed relative to information traveling along other paths in the IC so that an incorrect value of an output state (i.e. an output voltage) from the IC is produced. Functional failures can be produced by various types of circuit elements including resistive interconnections and switching transistors. An increased resistance in a resistive interconnection can slow down the flow of electricity through that interconnection. Similarly, a delay in a switching transition of a transistor can slow down the flow of an electrical signal being transmitted through that transistor.

The delay in information travel produced by critical timing paths or resistive interconnections is frequency dependent so that over a certain range of clock frequencies, the IC behaves as expected in response to a set of input test vectors since for this range of frequencies the timing error can be accommodated by the IC. However, at higher clock frequencies, the IC can produce an abnormal or inconsistent output in response to the same set of input test vectors. The presence of functional failures in an IC can thus limit the range of clock frequencies over which the IC can be used. Similarly, functional failures can appear in an IC when the IC is operated at a temperature that is too high or too low, or when the operating voltage to the IC is outside a certain range.

An ability to locate any circuit elements which produce or contribute to functional failures is of value since this allows a particular IC to be optimized for speed and accuracy by designing the IC and/or the IC fabrication processes so as to eliminate or minimize critical timing paths or resistive interconnections in the IC, thereby minimizing timing errors in the IC. This can result in an increase in the speed at which the IC can be operated and validated as being free from functional failures. From an economic standpoint, ICs (e.g. computer chips) validated for operation at higher-speeds are of greater value and can gain more market share than lower-speed ICs. Additionally, an ability to locate the circuit elements responsible for producing functional failures in an IC is important for quality control during IC fabrication, for failure analysis of ICs, and for qualification and acceptance testing of ICs.

Heretofore, the analysis of functional failures in ICs has been difficult and time consuming. One method for characterizing critical timing paths and analyzing timing related failure modes in ICs is based on localized photocurrent generation as disclosed in U.S. Pat. No. 4,698,587 to Burns et al. The method of Burns et al is complicated, requiring that the "ON" and "OFF" states of each transistor being tested be completely mapped during each clock cycle. The information thus obtained must then be stored so that it can be used subsequently to perturb operation of each transistor only during times in which the transistor is transitioning from the "ON" state to the "OFF" state. This perturbation is performed using an above-bandgap focused laser beam which induces a leakage photocurrent in the transistor due to photogenerated carriers (i.e. electrons and holes). This leakage photocurrent slows down switching in the transistor, with the transition time required for the transistor to reach the "OFF" state being measured by detecting the induced photocurrent.

What is needed is a method of rapidly measuring functional failures in an IC without the need to first obtain a detailed knowledge of the state of each transistor during each clock cycle. Additionally, a method is needed which allows the identification of circuit elements of whatever type that contribute to timing errors and thereby produce functional failures in an IC. Finally, a method is needed which quickly and directly pinpoints the location of any circuit elements in the IC producing the functional failures without resorting to complicated calculations or analysis.

An advantage of the present invention is that it does not require a detailed knowledge of the state of each transistor in an IC being tested during each clock cycle.

Another advantage of the present invention is that it does not require a photocurrent to be generated in the IC being tested.

A further advantage of the present invention is that it can identify and localize functional failures produced different types of circuit elements, including transistors and resistive interconnections.

Yet another advantage of the present invention is that it can be used to directly and simply form an image or map of the location of any circuit elements in an IC which are responsible for producing functional failures therein.

Still another advantage of the present invention is that it does not measure permanent defects such as open-circuit or short-circuit defects which are unrelated to functional failures and timing errors.

A further advantage of the present invention is that it is nondestructive so that it can be used for qualification testing of ICs without permanently damaging the ICs.

Yet another advantage of the present invention is that it is applicable to the measurement of functional failures in ICs which employ multiple levels of patterned metallization, and to the measurement of functional failures in ICs which are mounted device-side-down in a flip-chip arrangement. The wavelength of a focused laser beam used in the present invention can be selected so that the substrate (e.g. comprising silicon, germanium or a III-V compound semiconductor) whereon the IC is fabricated is sufficiently transmissive to the laser beam so that analysis can be performed through the substrate. This can simplify the analysis since the focused laser beam can access circuit elements (e.g. transistors) of the IC without being blocked by multiple levels of patterned metallization which can overlie the circuit elements.

These and other advantages of the method of the present invention will become evident to those skilled in the art.

SUMMARY OF THE INVENTION

The present invention relates to an apparatus for analyzing an IC to identify at least one circuit element responsible for producing a functional failure in the IC. The apparatus comprises means for operating the IC under conditions wherein the functional failure occurs, with the functional failure producing over time a fraction of defective (i.e. incorrect) output states (i.e. output voltages) and a remainder of good output states at one or more outputs from the IC in response to a set of input test vectors repeatedly provided to the IC; a laser producing a beam having a photon energy that is less than a bandgap energy of a substrate (e.g. a silicon substrate) whereon the IC is formed; means for focusing and scanning the laser beam across the IC, thereby producing localized heating within the IC that generates a change in the fraction of defective output states from the IC, the focusing and scanning means further providing a position signal to indicate the location of the laser beam on the IC at any instant in time; and means, receiving inputs of the position signal and the change in the fraction of defective output states from the IC, for mapping the location of each circuit element within the IC responsible for the change in the fraction of defective output states from the IC. The apparatus of the present invention can be used to locate circuit elements such as transistors (e.g. switching transistors) or resistive interconnections that are responsible for producing the functional failures, if any, in an IC being tested.

The means for operating the IC under conditions wherein the functional failure occurs can comprise one or more of the following: a power supply providing an operating voltage to the IC; a temperature-controlled stage for holding the IC and maintaining the IC at a selected temperature; a clock for operating the IC at a selected frequency; means (e.g. an optical filter or electro-optic modulator) for controlling a power level of the laser beam, or means (e.g. a digital IC tester or a computer-controlled switch matrix) for controlling a rate at which the set of input test vectors are repeatedly provided to the IC.

The photon energy of the laser beam is generally selected so that it is insufficient to produce a photocurrent in the IC. In the case of a silicon substrate, the photon energy of the laser beam can be at a wavelength in the range of 1.2 to 2.5 microns, and preferably about 1.3 microns. The laser beam is focused to a spot on the IC to locally heat particular circuit elements in the IC at any instant in time. This can be done, for example, by focusing the laser beam to a micron-sized spot after the laser beam is transmitted-through the substrate.

The means for focusing and scanning the laser beam across the IC comprises at least one lens or curved mirror for focusing the laser to a spot, and further comprises a plurality of moveable mirrors arranged to scan the laser beam in two dimensions. In some embodiments of the present invention, the means for focusing and scanning the laser beam across the IC can comprise a conventional scanning optical microscope (also termed a laser scan microscope).

The mapping means can comprise a display for displaying a map (i.e. an image) to indicate the location of the circuit element in the IC responsible for the change in the fraction of defective output states from the IC. The mapping means can further include an image processor or a computer for accumulating and storing information about the location of the circuit elements in the IC responsible for the change in the fraction of defective output states from the IC. Finally, the mapping means can include a photodetector for detecting a portion of the laser beam reflected or scattered from the IC, with the photodetector providing a detector output signal for generating in combination with the position signal a reflected-light image of the IC being analyzed.

The present invention further relates to an apparatus for analyzing an IC to locate any signal propagation paths that produce timing errors within the IC that result in an incorrect value of an output voltage from the IC. This analysis apparatus comprises means for operating the IC under conditions which produce an incidence (i.e. a rate) of the timing errors in the IC in response to a set of input test vectors provided to the IC; a laser having a beam with a photon energy less than a bandgap energy of a semiconductor substrate whereon the IC is formed; a scanning optical microscope for receiving the laser beam and producing therefrom a focused laser beam which is scanned across a portion of the IC, with the scanning optical microscope further generating a position signal indicative of the position of the focused laser beam at any instant in time, and with the focused laser beam producing localized heating within the IC that changes the incidence of the timing errors in the IC; means connected to the IC for measuring the output voltage from the IC and generating therefrom an analytical output signal whenever the output voltage switches between the incorrect value (i.e. a no-good, defective or faulty value) and a correct value (i.e. a good value); and a display for receiving the position signal and the analytical output signal and generating therefrom a map for locating each signal propagation path within the IC responsible for producing the timing errors.

The means for operating the IC to produce the incidence of timing errors therein can comprise one or more of the following: a stage for heating or cooling the IC; a power supply for providing an operating voltage to the IC; a clock for operating the IC at a selected frequency; means for controlling a power level of the laser beam; or means (e.g. a digital IC tester or a computer-controlled switch matrix) for controlling a rate at which the set of input test vectors are provided to the IC.

The laser beam has a photon energy that is insufficient to produce a photocurrent in the IC. For an IC fabricated on a silicon substrate, the photon energy of the laser beam can be in the range of 1.2–2.5 microns, and preferably about 1.3 microns. An optical filter can be placed in a path of the laser beam, if necessary, to remove any light generated by the laser having a photon energy greater than or equal to the bandgap energy of the semiconductor substrate, thereby preventing the generation of any photocurrents within the IC. Such an optical filter may be necessary, for example, if the laser emits light at a plurality of different wavelengths, including wavelengths corresponding to photon energies above and below the bandgap energy of the substrate. The optical filter can then be used to remove the lasing light from the beam at wavelengths for which the photon energy is above the bandgap energy of the substrate so that no photocurrents are produced.

The scanning optical microscope (also termed a laser scan microscope) comprises at least one lens or curved mirror for focusing the laser beam to a spot, and can further include a photodetector for detecting a portion of the laser beam reflected or scattered from the IC to generate a detector output signal which can be used in combination with the position signal to form a reflected-light image of the IC on the display for superposition with the map to pinpoint the location of each signal propagation path within the IC responsible for producing the timing errors. This can be done even though the laser beam is transmitted through the substrate as is generally required for analyzing ICs mounted in a flip-chip configuration.

The means for measuring the output voltage from the IC and generating the analytical output signal can comprise a latch (e.g. a D-flip-flop) which switches between a pair of logic states therein in response to a change in the output voltage from the IC from the incorrect value to the correct value, or from the correct value to the incorrect value. This allows the apparatus to discriminate between normal (i.e. correct) operation of the IC and abnormal (i.e. incorrect) operation so that only those circuit elements contributing to the timing errors and thereby producing the functional failures in the IC are visualized.

The apparatus can further include an image processor for accumulating a plurality of maps (i.e. images) over time generated from the position signal and the analytical output signal. In this way, the image processor can generate an enhanced-resolution map that can be used to more precisely locate each signal propagation path within the IC responsible for producing the timing errors. A computer can also be used in the apparatus to store information about the location of each signal propagation path producing the timing errors in the IC. Circuit elements which produce timing errors in a signal propagation path can include one or more switching transistors, or one or more resistive interconnections which are defined herein as electrical interconnections having a resistance that is different (i.e. larger or smaller) from the resistance of other similar interconnections in the IC which do not produce timing errors.

Finally, the present invention relates to a method for analyzing an IC and identifying any circuit elements therein responsible for producing functional failures in the IC. The method comprises steps for controlling operational parameters of the IC to induce a level of incidence (i.e. a rate) of the functional failures therein, with the functional failures producing an incorrect value of an output voltage from the IC in response to a set of input test vectors provided to the IC; scanning the IC with a focused laser beam having a photon energy less than a bandgap energy of a substrate whereon the IC is formed to locally heat circuit elements within the IC, thereby changing the level of incidence of the functional failures in the IC; and measuring the change in the level of incidence of the functional failures in the IC as a function of the position of the focused laser beam incident on the IC, thereby locating the circuit elements in the IC responsible for producing the functional failures therein. The method of the present invention can further include a step for forming a map (i.e. an image) of the location of the circuit elements in the IC responsible for producing the functional failures in the IC (e.g. by detecting a portion of the focused laser beam reflected or scattered from the IC), and a step for forming a reflected-light image of the IC for superposition with the map to precisely locate the circuit elements in the IC responsible for producing the functional failures.

The step for controlling operational parameters of the IC to induce the level of incidence of the functional failures therein can comprise controlling a voltage for powering the IC, controlling the temperature of the IC, controlling a clock frequency provided to the IC, controlling a rate at which the set of input test vectors is provided to the IC, controlling a power level of the focused laser beam, or a combination thereof.

When the substrate comprises silicon, the step for scanning the IC with the focused laser beam can comprise scanning the IC with a focused laser beam having a wavelength in the range of 1.2 to 2.5 microns, and preferably about 1.3 microns. The step for scanning the IC with the focused laser beam can further comprise scanning the IC from a backside of a substrate whereon the IC is formed, with the focused laser beam being transmitted through the substrate. Finally, the step for scanning the IC with the focused laser beam can include generating a position signal for indicating the location of the focused laser beam on the IC at any instant in time.

The step for measuring the change in the level of incidence of the functional failures in the IC as a function of the position of the focused laser beam incident on the IC can comprise comparing the value of the output voltage from the IC at each clock cycle and detecting a change in the value of the output voltage from the IC. Additionally, a step can be provided for generating an analytical output signal having an intensity that depends upon the value of the output voltage from the IC, with the analytical output signal being in a first state when the output voltage from the IC has an incorrect value, and with the analytical output, signal being in a second state when the output voltage from the IC has a correct value. Furthermore, the step for measuring the change in the level of incidence of the functional failures in the IC as a function of the position of the focused laser beam incident on the IC can comprise repeatedly scanning the IC with the focused laser beam and accumulating changes in the level of incidence of the functional failures in the IC over time. This can be used to improve a level of detectability of the circuit elements in the IC responsible for producing the functional failures in the IC.

Additional advantages and novel features of the invention will become apparent to those skilled in the art upon examination of the following detailed description thereof when considered in conjunction with the accompanying drawings. The advantages of the invention can be realized and attained by means of the instrumentalities and combinations particularly pointed out in the appended claims.

BRIEF DESCRIPTION OF THE DRAWINGS

The accompanying drawings, which are incorporated into and form a part of the specification, illustrate several aspects of the present invention and, together with the description, serve to explain the principles of the invention. The drawings are only for the purpose of illustrating preferred embodiments of the invention and are not to be construed as limiting the invention. In the drawings.

DETAILED DESCRIPTION OF THE INVENTION

Figure 1:
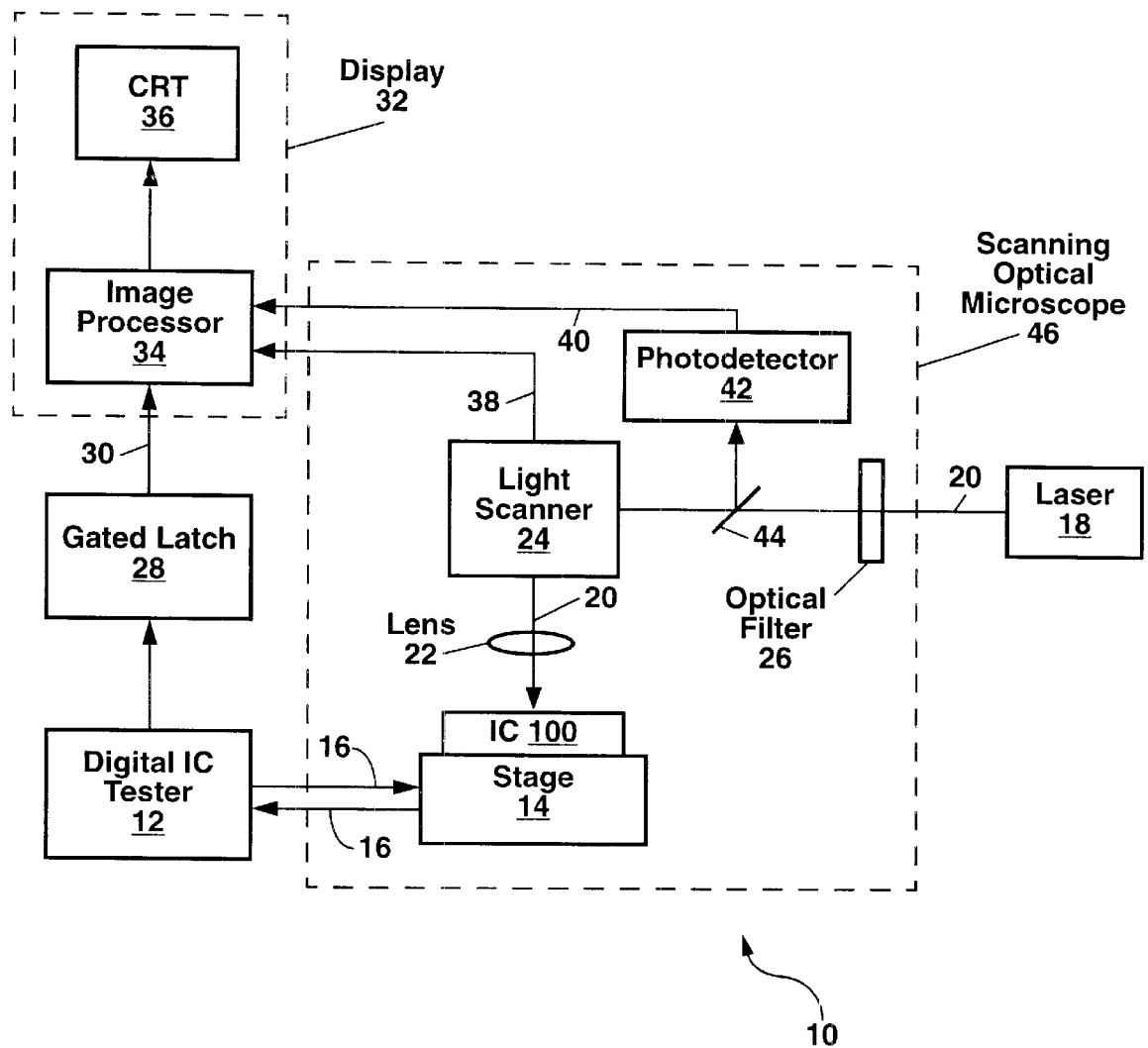
FIG. 1 shows a schematic representation of the IC analysis apparatus of the present invention.

Referring to FIG. 1, there is shown schematically an embodiment of the IC analysis apparatus 10 of the present invention. The apparatus 10 in FIG. 1 comprises a digital IC tester 12 (e.g. an Integrated Measurement Systems, Inc., Model ATS FT or Model ATS Blazer! IC tester) or alternately a computer-controlled switch matrix (not shown) interconnected to an IC 100 being tested to provide a set of input test vectors to the IC 100 and to measure output states from the IC 100 in response to the input test vectors. A set of input test vectors is defined herein as a set of input voltages that are provided to input pins of the IC 100 either all at once or in a predetermined sequence in order to produce a desired response from the IC 100 in the, form of one or more output states as defined by output voltages at output pins of the IC 100. Those skilled in the art will understand that the same pins of an IC can provide both inputs and outputs depending upon how the IC operates during different clock cycles.

In FIG. 1, the IC 100 is supported upon a stage 14 which can be used to make a plurality of interconnections 16 between the IC 100 under test and the digital IC tester 12. In testing the IC 100 with the apparatus 10 in FIG. 1, the IC 100 is operated under conditions designed to produce functional failures at a predetermined rate (e.g. with the IC 100 almost always failing to provide a correct value of one or more output states, or with the IC 100 almost always passing in providing the correct values of the output states, or with a predetermined pass/fail percentage of the output states in the IC 100 such as a 50% pass rate and a 50% failure rate).

The IC analysis apparatus 10 in FIG. 1 further comprises a laser 18 which produces a light beam 20 that is used to irradiate a portion of the IC 100 under test and to perturb operation of the IC 100 by changing the rate at which functional failures occur therein. The IC 100 to be tested can be in wafer form (i.e. a plurality of ICs on a common semiconductor substrate), in die form (i.e. a single unpackaged IC), or in packaged form. For analysis of a completely packaged IC 100, a portion of the IC package can be removed (e.g. by lid removal or mechanical polishing) to expose a particular side of the IC for optical access by the focused and scanned laser beam 20. The term "analysis" as used herein is intended to refer to both failure analysis and qualification testing.

A functional failure is defined herein as a failure mechanism which arises from a timing error within an IC. The functional failure occurs when an electrical signal in the IC arrives at its destination either too early or too late so that an incorrect value of an output state (i.e. an output voltage) is produced at one or more output ports of the IC during a particular clock cycle.

Functional failures can occur, for example, when the IC 100 is operated at a clock frequency that is too high, or when one or more circuit elements within the IC 100 produce an excessive or unaccounted for signal delay in switching in a transistor, or in propagating a signal along a path. Functional failures can also occur when the IC 100 is powered by a power supply voltage or current which is outside a range for which the IC 100 has been designed, or when the IC 100 is operated at a temperature outside a normal operating range for the IC 100. Functional failures can arise as a result of particular operating conditions for the IC 100 even though the IC 100 operates perfectly under other operating conditions. Thus, a functional failure is different from a physical defect such as an open circuit or a short circuit, and results from suboptimal performance of particular circuit elements in the IC which produce timing errors. These circuit elements can be, for example, switching transistors which switch between logic states at a rate that is slower than normal, or interconnections in the IC which have a resistance that is larger than an expected value. In general, anything within an IC that results in or contributes to a particular signal within the IC being advanced or delayed in propagation by one or more clock cycles compared with the time at which the signal should appear can result in a functional failure in the IC 100.

In FIG. 1, the laser beam 20 is focused onto the IC 100 by a lens 22 (or alternately by one or more curved mirrors) and is scanned in position across the IC 100 by a light scanner 24. The incident laser beam 20 is used to locally heat particular portions of the IC 100 and thereby temporarily perturb operation of these portions of the IC 100 so that the incidence of functional failures in the IC 100 changes. It is this change in the rate or incidence of functional failures in the IC 100 which is measured to locate the circuit elements which give rise to the functional failures. The intensity of the focused laser beam 20 can be adjusted using an optical filter 26 (e.g a neutral density filter) so that circuit elements which are normal (i.e. a majority of the circuit elements within the IC 100) will not produce functional failures with the localized heating produced by the focused laser beam 20; whereas circuit elements which are abnormal in some way (e.g. due to suboptimal design or manufacturing) will either begin to produce such functional failures, or will increase the rate or fraction of functional failures that occurs.

In FIG. 1, the change in the rate of the functional failures upon heating a particular portion of the IC 100 is sensed using a gated latch 28 which compares the output state of the IC 100, which is defined herein as a set of output voltages at one or more output ports (i.e. pins) of the IC 100 at a particular instant in time (i.e. a particular clock cycle), with an expected value of the output state in response to a set of input test vectors (i.e. a particular instruction or set of instructions provided to the IC 100). The gated latch 28 provides an analytical output signal 30 indicative of the change in the rate of functional failures in the IC 100 being tested, with the analytical output signal 30 being directed to a display 32.

The display 32 as shown in FIG. 1 includes an image processor 34 and a cathode ray tube (CRT) 36. The display 32 uses the analytical output signal 30 and a position signal 38 from the light scanner 24 which indicates the location of the focused laser beam 20 on the IC 100 at any instant in time to generate a map of the change in the incidence of functional failures in the IC 100 upon localized heating by the focused laser beam 20. The map can then be used for locating circuit elements in the IC 100 which produce the functional failures. These circuit elements are generally the same elements which produced the initial incidence of functional failures in the IC 100 in the absence of heating with the focused laser beam 20. In other embodiments of the present invention, the display 32 can be a computer (not shown), which can optionally be used to control the IC tester 12 and/or to measure the change in the output states from the IC 100.

As an aid in locating the circuit elements responsible for producing the functional failures, a reflected-light image or map of the IC 100 can be produced in the display 32 either separately or superposed with the map of the functional failures. The reflected-light image can be constructed from the position signal 38 and from a detector output signal 40 from a photodetector 42 (e.g. a germanium photodetector) which measures a return portion of the focused laser beam 20 that is reflected or scattered from the IC 100. This can be done, for example, by placing a beamsplitter 44 in the path of the laser beam 20 as shown in FIG. 1.

Various elements of the apparatus 10 including the stage 14, the lens 22, the light scanner 24 and the photodetector 42 can be combined in the form of a conventional scanning optical microscope 46 (e.g. a Carl Zeiss, Inc., Model LSM 310 scanning optical microscope) as known to the art. The laser 18 and one or more optical filters 26 can be located either inside or outside the scanning optical microscope 46, with the light from the laser 18 being coupled into the scanning optical microscope 46 through free space, or through an optical fiber. The scanning optical microscope 46 can further include an eyepiece or video camera (not shown) for visually identifying and selecting a particular portion of the IC 100 to be analyzed, or for centering the IC 100 on the stage 14.

An IC 100 that has been selected for analysis, can be placed onto the stage 14 which generally will contain a socket for making electrical connections to and from the IC 100. The IC 100 can then be operated with a predetermined set of operational parameters selected to produce an occurrence of the functional failures in the IC 100 at a predetermined rate (e.g. 50% pass / 50% fail). This can be done in various ways. For example, a power supply voltage to the IC 100 can be reduced to a value below a normal operating voltage for which the IC was designed to induce functional failures in the IC 100 to occur. The power supply used for the present invention comprises a constant-voltage power supply rather than a constant-current power supply.

Alternately, an operating temperature of the IC 100 can be changed by controlling the temperature of the stage 14 (e.g. by heating the stage 14 using an electrical resistance heating element or a thermoelectric module, or by cooling the stage 14 using the thermoelectric module, or a refrigeration system or a flow of a gas such as air). Other ways of inducing the functional failures in the IC 100 include increasing the frequency of a clock (e.g. in the digital IC tester 12) controlling timing in the IC 100 beyond a normal operating range of clock frequencies, or by increasing the rate at which a set of input test vectors is repeatedly provided to the IC 100, or by changing a power level of the focused laser beam 20 to change the amount of localized heating produced within the IC 100. These various methods of inducing functional failures to occur in the IC 100 can be used in combination to generate the predetermined rate at which the functional failures occur for analysis of the IC 100.

The rate at which the functional failures are occurring in the IC 100 can be set by comparing an output state from the IC 100 with an expected value for that output state. This can be done in various ways. In the embodiment of the present invention in FIG. 1, this is done using a gated latch 28 and the display 32 by viewing an intensity level of an image on the CRT 36 produced by the analytical output signal 30 and the position signal 38. A gray-scale background level on the CRT 36 can thus be viewed and used to adjust the operational parameters for the IC 100 to correspond to a predetermined incidence of the functional failures in the IC 100. Once the gray-scale background level has been set, any localized change in the incidence of the functional failures can show up as a lighter spot (generally for an increased incidence of the functional failures), or as a darker spot (generally for a decreased incidence of the functional failures). In other embodiments of the present invention, the rate at which the functional failures are occurring in the IC 100 can be set by using a computer, or by using the digital IC tester 12 to compare the output state of the IC 100 with the expected output state, while a set of input test vectors is repeatedly provided to the IC 100.

Once a predetermined level of functional failures in the IC 100 under test has been set, operation of the IC 100 can be locally perturbed using the focused laser beam 20. This can be done, for example, by raster scanning the focused laser beam 20 across the IC 100 to locally heat the circuit elements in the IC 100 for an instant of time. Alternately, the focused laser beam 20 can be stepped across the IC 100 dwelling at particular points for a predetermined time to form a map or image comprising an array of pixels.

Present ICs generally employ multiple levels of patterned metallization that can obscure lower electrical conductor levels, thereby complicating failure analysis or qualification testing from a device side of the IC whereon the levels of patterned metallization are formed. Additionally, flip-chip packaging can make device-side analysis difficult, if not impossible. The present invention can provide a solution to these problems by allowing the focused laser beam 20 to be scanned over the device-side of the IC 100, or alternately transmitted through a substrate (e.g. silicon) whereon the IC 100 is fabricated to irradiate the IC 100 from its backside. The substrate, which is relatively transparent to light at below-bandgap photon energies, can be polished and/or thinned as necessary.

Analysis of the IC 100 through the substrate can be performed by selecting a photon energy for the laser 18 that is less than a bandgap energy of the substrate. In the case of a silicon or silicon-on-insulator (SOI) substrate which comprises monocrystalline silicon, the bandgap energy can correspond to a lasing wavelength, (which is inversely related to photon energy) that is in the range of 1.2 to 2.5 microns, and preferably about 1.3 microns. Such a wavelength for the laser 18 provides for localized heating in the IC 100 without the generation of any photogenerated carriers which can produce photocurrents. The presence of photocurrents in an IC 100 being tested can produce spurious signals which are not due to functional failures and which can complicate the analysis of functional failures.

Particular type of lasers 18 that can be used in the apparatus 10 include solidstate lasers 18 such as a neodymium:yttrium-vanadium-oxide (Nd:YVO$_4$) laser operating at a wavelength of 1.34 $\mu$m, or a neodymium:yttrium-aluminum-garnet (Nd:YAG) laser operating at a wavelength of 1.32 $\mu$m. In general, any laser operating in the wavelength range of 1.2–2.5 $\mu$m and emitting sufficient laser power (e.g. 50–500 mW or more) to produce localized heating within the IC 100 can be used for practice of the present invention. In some instances, a laser 18 selected for use with the apparatus 10 of the present invention can emit lasing at a plurality of wavelengths including wavelengths that are above the bandgap energy of the substrate. Such lasers can be modified to eliminate the above bandgap lasing by placing an optical filter (e.g. a long-wavelength pass filter) in the path of the light beam 20, or alternately by selecting internal cavity mirrors in the laser 18 that restrict operation to wavelengths in the range of about 1.2–2.5 $\mu$m.

The present invention is also applicable to ICs 100 formed on other types of substrates including germanium substrates and III-V compound-semiconductor substrates (e.g. GaAs or InP). In each case, the wavelength of the laser 18 is selected so that the photon energy of the lasing beam 20 is less than a bandgap energy of the semiconductor material forming the substrate. Thus, for measurements at room temperature, the wavelength of the laser 18 should be selected to be about 1.9 $\mu$m or greater for a germanium substrate, about 0.9 $\mu$m or greater for a gallium arsenide (GaAs) substrate, and about 1 $\mu$m or greater for an indium phosphide (InP) substrate. Those skilled in the art will know that various types of semiconductor diode, solid-state or gas lasers are available for use at the above wavelengths.

In FIG. 1, the laser 18 preferably operates in a single transverse mode for optimal focusing of the laser beam 20. The laser 18 can operate either in a continuous-wave (cw) mode, or in a pulsed mode, with an output power from about 50 milliwatts (mW) to a few hundred mW depending on a focused spot size of the laser beam 20 and whether the irradiation of the IC 100 is from a device side (i.e. a top of the substrate whereon the circuit elements are fabricated), or through the substrate. The localized heating produced by the focused laser beam 20 can be on the order of 1° C/mW.

The polarization of the laser 18 can be selected for optimum transmission of the laser beam 20 through the various optical elements located within a path of the laser beam 20. This can be done, for example, by placing a linear polarizer or polarization rotator in the path of the laser beam 20 close to the laser 18. Additionally, an electro-optic modulator (not shown) can be placed in the path of the laser beam 20 and used as an alternative to the optical filter 26 for controlling and adjusting the power in the focused laser beam 20. In some instances, the power in the focused laser beam 20 can be adjusted by controlling a current or excitation level of the laser 18.

In FIG. 1, the light scanner 24 can comprise a pair of galvanometers that each support and control movement of a plane mirror, with the mirrors being in an x-y arrangement so that the laser beam 20 can be scanned in two dimensions. In other embodiments of the present invention, an acousto-optical modulator or an electro-optical modulator can be substituted for the galvanometer-driven mirrors to form the light scanner 24.

The light scanner 24 can be controlled to step or raster scan the focused laser beam 20 over a predetermined portion of the IC 100, or over the entire IC 100. The light scanner 24 further provides an output position signal 38 that can be used to determine the position of the focused laser beam 20 on the IC 100 at any instant in time. The position signal 38 can be derived, for example, from a voltage waveform used to drive the galvanometers. The light scanner 24 can provide either a continuous scan over a portion of the IC 100, or a stepped scan. When the scan is stepped, the portion of the IC 100 being scanned can be divided into a predetermined number of pixels, with the light scanner 24 directing the focused laser beam 20 from pixel to pixel, dwelling at each pixel for a predetermined number of clock cycles to allow data to be accumulated and signal averaged by the image processor 34. Such signal averaging can be used to form an enhanced-resolution map for more precisely locating each circuit element or signal propagation path within the IC 100 which produces the timing errors resulting in the functional failures of the IC 100. This can also improve a level of detectability of the circuit elements in the IC 100 responsible for producing the functional failures therein.

After traversing the light scanner 24 in FIG. 1, the light beam 20 is focused by one or more lenses 22 (e.g. an objective lens), or alternately by one or more curved mirrors. The light beam 20 is focused to a spot of a predetermined size (e.g. 1–5 μm) which, in general, depends on the focal length of the lens 22 and the divergence of the laser 18. The focal length of the lens 22 can be selected depending on a desired resolution limit for the measurements.

The focused laser beam 20 produces localized heating within the IC 100 being tested. This localized heating can momentarily change the resistance of a resistive interconnection within the IC 100, thereby changing the time required for a signal to propagate along that resistive interconnection. If the resistance of the interconnection is increased as a result of the localized heating with the focused laser beam 20, then a signal propagation time in the resistive interconnection will increase. Likewise, if the resistance of the interconnection decreases, the signal propagation time will decrease. This increase or decrease in signal propagation time can slow down or speed up the flow of information along the resistive interconnection, thereby resulting in the signal being propagated along the resistive interconnection being out of sync with other signals in the IC 100, thereby resulting in an incorrect output state from the IC 100 which appears as an incorrect output voltage on one or more output pins of the IC 100. This localized heating with the focused laser beam 20 can thus change the incidence of functional failures in the IC 100 which, in turn, can be measured with the apparatus 10.

Resistive interconnections are a major IC yield, performance and reliability problem, and will increase in importance as the number of interconnection levels and operating frequencies of the ICs increase. An ability to localize defective interconnections having too large a resistance is critical to diagnosing IC failures and implementing corrective action in the design of the ICs or in processes used to fabricate the ICs. With conventional probing techniques, resistive interconnections can be extremely difficult and time consuming to locate since they normally require high-frequency operation to produce a functional failure, and further require a great deal of repetitive probing to identify. Such probing techniques are further complicated by multiple levels of interconnect metallization that are used in present ICs.

Similarly, the signal propagation time in one or more transistors (e.g. switching transistors) can be affected momentarily by the incident focused laser beam 20, since a switching time in the transistors (e.g. from an "ON" state to an "OFF" state, or from an "OFF" state to an "ON" state) can increase as a result of the localized heating which reduces the mobility of charge carriers in the transistors. No photogenerated carriers (i.e. electrons and holes) are produced which can give rise to photocurrents since the photon energy of the focused laser beam 20 is chosen to be less than the bandgap energy of the semiconductor substrate (e.g. silicon). Thus, the change in signal propagation time results purely from thermal effects.

In FIG. 1, the change in the incidence of functional failures in the IC 100 can be detected by comparing the actual output state(s) from the IC 100 with expected values of the output state(s) as the IC 100 is repeatedly cycled through a functional test. The IC operating voltage and temperature, and the clock frequency or the frequency at which a set of input test vectors are provided to the IC 100 under test can be adjusted to produce a predetermined functional failure rate (e.g. a failure rate of about 50% incorrect values of an output voltage from the IC 100) during cycling of the input test vectors. Under these conditions, a change in localized heating due to the presence of the focused laser beam 20 will affect any circuit elements responsible for producing the functional failures to either increase or decrease the rate of the functional failures depending upon whether the signal being propagated through those circuit elements is arriving at its destination ahead of schedule during a clock cycle, or behind schedule. Additionally, the rate of functional failures within the IC 100 can be changed by varying the power level in the focused laser beam 20 (e.g. by repeatedly scanning the IC 100 at different power levels, or by stopping the focused laser beam 20 at the location of particular circuit elements and then changing the power level in the focused laser beam over time).

For repeated cycling of a set of input test vectors to the IC 100, the output state of the IC 100 can compared with itself over time. This can be done, for example, by routing the output state from the IC 100 the digital IC tester 12 to a gated latch 28 as shown in FIG. 1 or directly to the latch 28, with the gated latch 28 acting to generate an analytical output signal 30 whenever the output state of the IC 100 changes.

Figure 2:
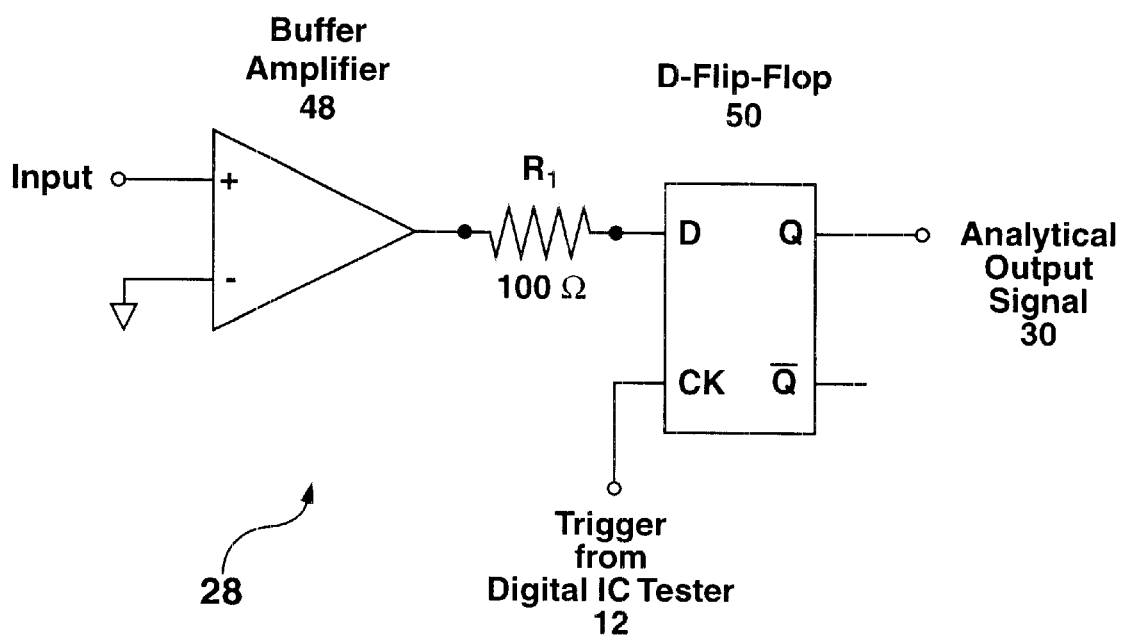
FIG. 2 shows a schematic diagram for a circuit that can be used in the apparatus of FIG. 1 to repeatedly measure an output voltage from the IC and generate therefrom an analytical output signal to indicate when the output voltage from the IC has changed state.

The gated latch 28 can be formed as shown schematically in FIG. 2 using a buffer amplifier 48 and a D-flip-flop 50. The buffer amplifier 48 receives as its input the output state to be detected (or an output voltage from the IC 100 which is representative of the output state to be detected) and amplifies the input (e.g. by a factor of two) to provide an amplified output voltage. The amplified output voltage is then fed into a D input (i.e. a data input) of the D-flip-flop 50, with the D-flip-flop 50 being triggered at a CK input (i.e. a clock input) by the digital IC tester 12. The signal level of the D input is then transferred to a Q output of the D-flip-flop 50 during a positive-going transition of a triggering clock pulse (the $\overline{Q}$ output is not used). The Q output value will remain constant until another positive-going clock pulse is received by the D-flip-flop 50 and the state of the output state from the IC has changed. Thus, the analytical output signal 30 is in a first state when the output state of the IC 100 has an incorrect value and switches to a second state when the output state of the IC has a correct value. In this way, the analytical output signal 30 depends directly on the incidence of functional failures in the IC 100 being tested so that any changes in the incidence of the functional failures can be measured. The analytical output signal 30 can be amplified, if necessary, to provide a predetermined level of contrast (i.e. a grayscale level) for the display 32. This can be done using an alternating current (ac) amplifier (not shown).

In other embodiments of the present invention, a computer can be substituted for the gated latch 28 with the computer acting to measure the output voltage (i.e. an output state) from the IC 100 and to compare the measured output voltage to an expected value. The computer can then generate an analytical output signal 30 whenever the measured output voltage deviates from the expected state.

In the display 32, the analytical output signal 30 is used in combination with the position signal 38 to form a map of the portion of the IC 100 being scanned by the focused laser beam 20 to show the changes in the rate of functional failures in the IC 100. The level of functional failures present in the IC 100 can initially be set as described previously. This, in combination with any necessary amplification of the analytical output signal 30, can be used to set a grayscale level in the display 32. Then, as the focused laser beam 20 is scanned over the IC 100 to produce localized heating therein, any change in the incidence of functional failures in the IC 100 will produce a change in the analytical output signal 30 which, in turn, will produce contrast variations in the display 32 which can be used to highlight and pinpoint the location of the circuit elements producing the functional failures. Once these suspect circuit elements have been identified, they can be examined in greater detail using other failure analysis methods as known to the art to understand why they produce the functional failures. This can lead to an improved design or improved processing for the circuit elements in the IC 100, thereby reducing or eliminating the incidence of the functional failures therein and improving operation of future ICs 100 of the same type.

The apparatus and method of the present invention can also be applied to the design of ICs by testing prototype ICs or circuit elements thereof to locate and eliminate any timing errors within the ICs that can result in limitations in speed (i.e. clock frequency) due to signals being propagated either too slow or too fast along certain paths in the ICs. Finally, the apparatus and method of the present invention provides a way of qualifying a batch of ICs 100 to select among those ICs according to certain criteria (e.g. operation with the lowest incidence of functional failures, or without any functional failures at all within a specified range of temperature, voltage or clock frequency; or operation at an increased speed).

To aid in locating the functional failures in the IC 100, a reflected-light image of the IC 100 can be formed by sampling a portion of the focused laser beam 20 that is reflected or scattered from the IC 100 and directed back along the path of the laser beam 20 to a photodetector 42 (e.g. a germanium photodetector) as shown in FIG. 1. The photodetector 42 detects the reflected or scattered portion of the light and produces a detector output signal 40 which can be fed into the display 32 and used in combination with the position signal 38 to form the reflected-light image. The reflected-light image can then be electronically superposed with the image of the changes in the functional failures produced from the analytical output signal 30. The reflected-light image can also be used for precisely focusing the laser beam 20 on the circuit elements in the IC 100 by observing the sharpness of details in the reflected-light image. This can be done when focusing the laser beam 20 through the substrate as well as for focusing the laser beam 20 on a device-side of the substrate. In general, the resolution of the reflected-light image will depend upon the spot size of the focused laser beam 20. Additionally, polishing and/or anti-reflection coating of the substrate side can be advantageous for improving the quality of the reflected-light image when this mode of irradiation is selected.

In FIG. 1, the image processor 34 receives the various signals 30, 38 and 40 and generates therefrom an x-y output signal (e.g. a video output signal) which can be used to drive the CRT 36. Additionally, the image processor 34 can provide capabilities for processing and storing the signals 30, 38 and 40, including averaging, contrast enhancing and digitizing the signals in order to generate maps or images with enhanced resolution for more precisely locating the circuit elements and signal propagation paths in the IC 100 that are responsible for producing timing errors which lead to the functional failures. The display 32 can be a part of the scanning optical microscope 46; or it can be in the form of a separate instrument (e.g. a computer).

An example illustrating operation of the apparatus and method of the present invention for locating a resistive interconnection producing functional failures in an IC 100 is provided hereinafter. Similar results can also be obtained for locating functional failures arising from critical timing path errors in other circuit elements (e.g. switching transistors) using the apparatus and method of the present invention.

Figure 3A:
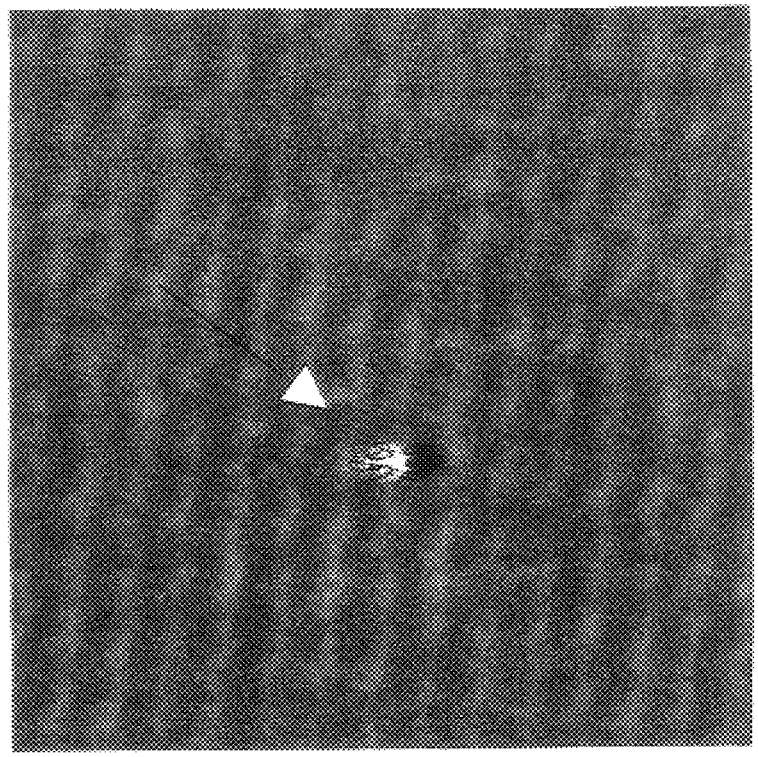
FIG. 3A shows an image obtained for a functional failure in an IC using the apparatus of FIG. 1.
Figure 3B:
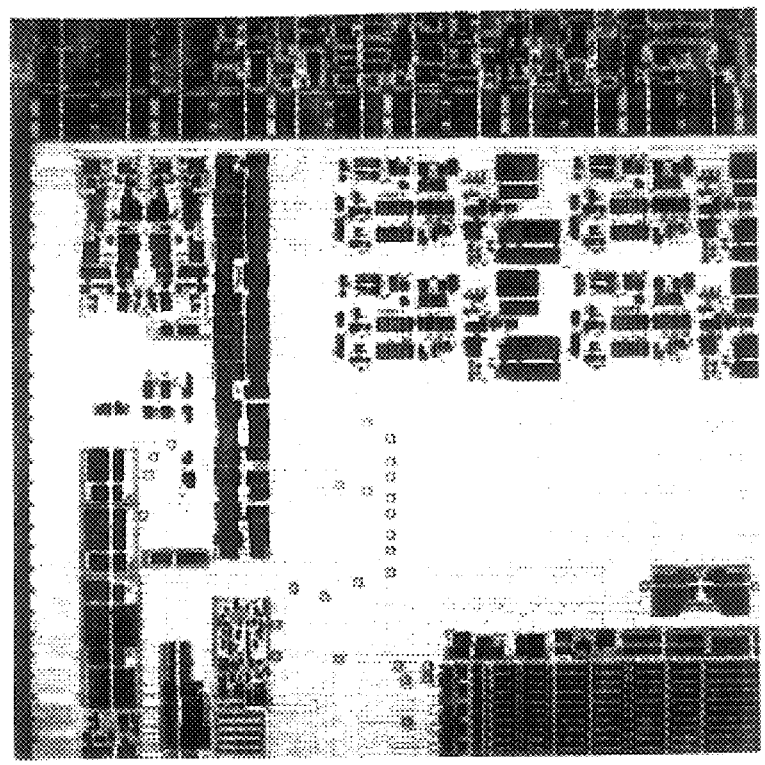
FIG. 3B shows a corresponding reflected-light image of the IC obtained with the apparatus of FIG. 1 for the same portion of the IC as in FIG. 3A.

FIG. 3A shows and image (i.e. a map) obtained through the substrate with the apparatus 10 of the present invention for a resistive interconnection site in a microprocessor 100; and FIG. 3B shows a reflected-light image through the substrate of the same portion of the microprocessor 100 for use in locating the circuit elements responsible for producing the functional failures therein. The location of the changing incidence of the functional failures in the microprocessor 100 upon irradiation with the focused laser beam 20 appears as a light (i.e. white) spot near the center of FIG. 3A and is indicated by the white-headed arrow. Although FIGS. 3A and 3B are shown separately, these images can be superposed in the display 32 to help pinpoint the circuit elements in the IC 100 responsible for producing the functional failures therein.

Figure 4A:
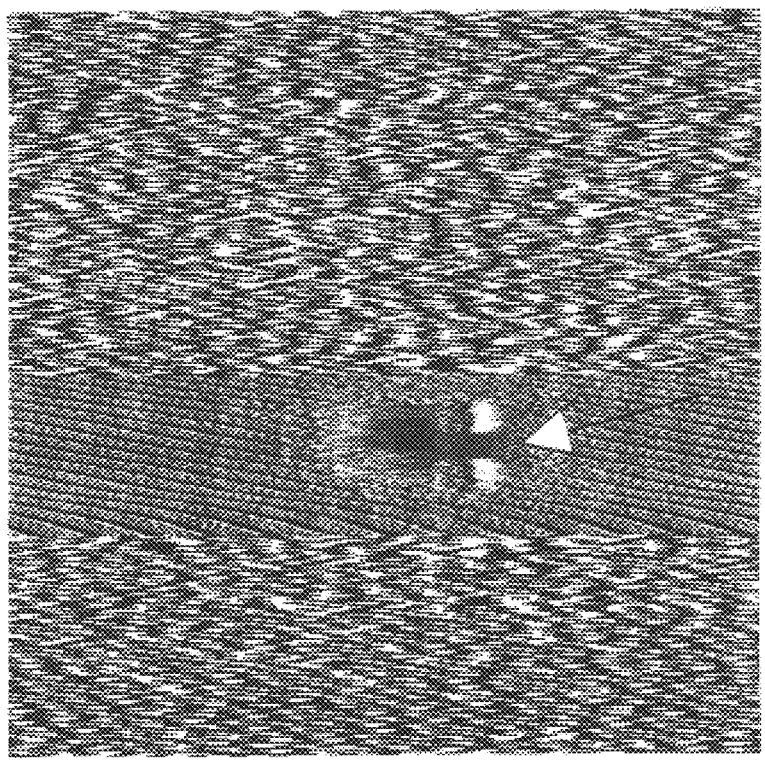
FIG. 4A shows an image of the functional failure in FIG. 3A, but at higher magnification.
Figure 4B:
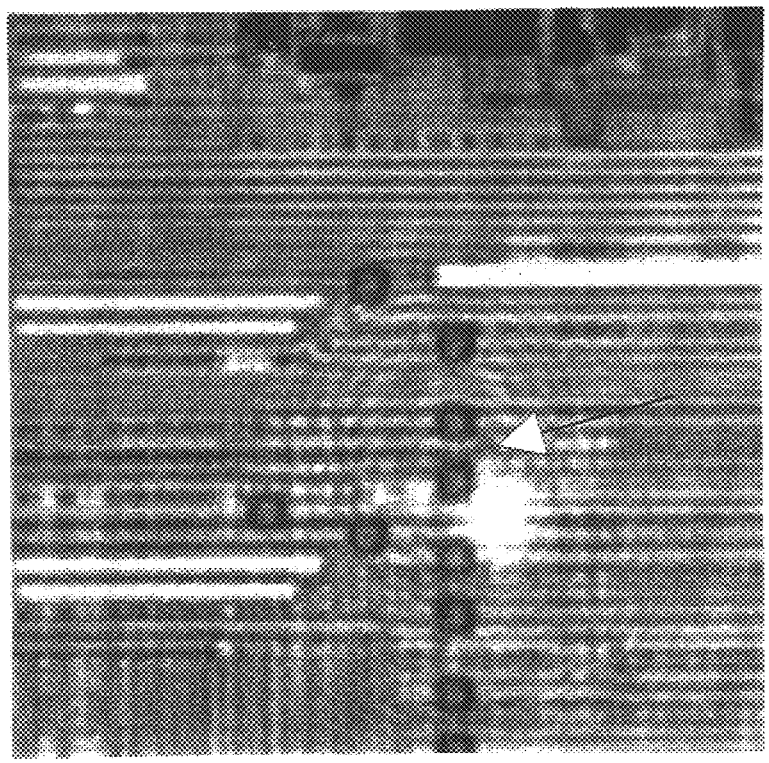
FIG. 4B shows a reflected-light image for the same portion of the IC as scanned in FIG. 4A.

FIGS. 4A and 4B show enlarged views of the regions in FIGS. 3A and 3B wherein the functional failure is produced, with the locations of the changing incidence of the functional failures and the circuit elements responsible therefor both indicated by the white-headed arrows. In FIG. 4A, the difference in the background for the image is due to changes in signal averaging, with the area surrounding the defect being signal averaged for a longer time than other areas free from the effects of the functional failures. In FIG. 4B, the circuit element responsible for producing the functional failures was determined to be a resistive via between a second level metallization and a third level metallization in the microprocessor 100. A focused ion beam cross section of the resistive via showed the via to be malformed, thereby confirming the results of the analysis performed using the apparatus and method of the present invention. A 100× objective lens 22 corrected for the thickness of the silicon substrate was used to obtain the images in FIGS. 4A and 4B.

The matter set forth in the foregoing description and accompanying drawings is offered by way of illustration only and not as a limitation. Other applications and variations of the apparatus and method of the present invention will become evident to those skilled in the art. Those skilled in the art will also understand that a computer-controlled switch matrix can be substituted for the digital IC tester 12 in FIG. 1. Furthermore, although the outputs from the IC 100 are shown in FIG. 1 as being routed through the digital IC tester 12 to the gated latch 28, those skilled in the art will understand that the outputs from the IC 100 can be routed directly to the gated latch 28 (e.g. using a high-frequency probe). The actual scope of the invention is intended to be defined in the following claims when viewed in their proper perspective based on the prior art.

What is claimed is:

1. An apparatus for analyzing an integrated circuit (IC) to identify at least one circuit element responsible for producing a functional failure in the IC, comprising:
   (a) means for operating the IC under conditions wherein the functional failure occurs, with the functional failure producing over time a fraction of defective output states and a remainder of good output states at an output from the IC in response to a set of input test vectors repeatedly provided to the IC;
   (b) a laser producing a beam having a photon energy less than a bandgap energy of a substrate whereon the IC is formed;
   (c) means for focusing and scanning the laser beam across the IC, thereby producing localized heating within the IC that generates a change in the fraction of defective output states from the IC, the focusing and scanning means further providing a position signal to indicate the location of the laser beam on the IC at any instant in time; and
   (d) means, receiving inputs of the position signal and the change in the fraction of defective output states from the IC, for mapping the location of each circuit element within the IC responsible for the change in the fraction of defective output states from the IC.

2. The apparatus of claim 1 wherein the circuit element within the IC producing the functional failure is a resistive interconnection.

3. The apparatus of claim 1 wherein the circuit element within the IC producing the functional failure comprises a transistor.

4. The apparatus of claim 3 wherein the transistor is a switching transistor.

5. The apparatus of claim 1 wherein the means for operating the IC under conditions wherein the functional failure occurs comprises means for controlling a power level of the laser beam.

6. The apparatus of claim 1 wherein the means for operating the IC under conditions wherein the functional failure occurs comprises a constant-voltage power supply providing an operating voltage to the IC.

7. The apparatus of claim 6 wherein the means for operating the IC under conditions wherein the functional failure occurs further comprises a temperature-controlled stage for holding the IC and maintaining the IC at a selected temperature.

8. The apparatus of claim 6 wherein the means for operating the IC under conditions wherein the functional failure occurs further comprises a clock for operating the IC at a selected frequency.

9. The apparatus of claim 6 wherein the means for operating the IC under conditions wherein the functional failure occurs further comprises means for controlling a rate at which the set of input test vectors are repeatedly provided to the IC.

10. The apparatus of claim 9 wherein the means for controlling a rate at which the set of input test vectors are repeatedly provided to the IC comprises a digital IC tester or a computer-controlled switch matrix.

11. The apparatus of claim 1 wherein the substrate comprises silicon.

12. The apparatus of claim 1 wherein the photon energy of the laser beam is insufficient to produce a photocurrent in the IC.

13. The apparatus of claim 1 wherein the photon energy of the laser beam is at a wavelength in the range of 1.2 microns to 2.5 microns.

14. The apparatus of claim 13 wherein the photon energy of the laser beam is at a wavelength of about 1.3 microns.

15. The apparatus of claim 1 wherein the means for focusing and scanning the laser beam across the IC comprises a scanning optical microscope.

16. The apparatus of claim 1 wherein the means for focusing and scanning the laser beam across the IC comprises at least one lens or curved mirror for focusing the laser to a spot.

17. The apparatus of claim 16 wherein the laser beam is focused to a spot after being transmitted through the substrate.

18. The apparatus of claim 16 wherein the means for focusing and scanning the laser beam across the IC further comprises a plurality of moveable mirrors arranged to scan the laser beam in two dimensions.

19. The apparatus of claim 1 wherein the mapping means comprises a display for displaying a map indicating the location of the circuit element in the IC responsible for the change in the fraction of defective output states from the IC.

20. The apparatus in claim 19 wherein the mapping means further comprises an image processor.

21. The apparatus of claim 1 wherein the mapping means comprises a computer for storing information about the location of the circuit elements in the IC responsible for the change in the fraction of defective output states from the IC.

22. The apparatus of claim 1 wherein the mapping means comprises a photodetector for detecting a portion of the laser beam reflected or scattered from the IC, with the photodetector providing a detector output signal for generating in combination with the position signal a reflected-light image of the IC being analyzed.

23. An apparatus for analyzing an integrated circuit (IC) to locate any signal propagation paths that produce timing errors within the IC that result in an incorrect value of an output voltage from the IC, comprising:

(a) means for operating the IC under conditions which produce an incidence of the timing errors in the IC in response to a set of input test vectors provided to the IC;

(b) a laser having a laser beam with a photon energy less than a bandgap energy of a semiconductor substrate whereon the IC is formed;

(c) a scanning optical microscope for receiving the laser beam and producing therefrom a focused laser beam which is scanned across a portion of the IC, with the scanning optical microscope further generating a position signal indicative of the position of the focused laser beam at any instant in time, and with the focused laser beam producing localized heating within the IC that changes the incidence of the timing errors in the IC;

(d) means connected to the IC for measuring the output voltage from the IC and generating therefrom an analytical output signal whenever the output voltage switches between the incorrect value and a correct value; and (e) a display for receiving the position signal and the analytical output signal and generating therefrom a map for locating each signal propagation path within the IC responsible for producing the timing errors.

24. The apparatus of claim 23 wherein the means for operating the IC to produce the incidence of timing errors therein comprises means for controlling a power level of the laser beam.

25. The apparatus of claim 23 wherein the means for operating the IC to produce the incidence of timing errors therein comprises a stage for heating or cooling the IC.

26. The apparatus of claim 23 wherein the means for operating the IC to produce the incidence of timing errors therein comprises a power supply for providing an operating voltage to the IC.

27. The apparatus of claim 23 wherein the means for operating the IC to produce the incidence of timing errors therein comprises a clock for operating the IC at a selected frequency.

28. The apparatus of claim 23 wherein the means for operating the IC to produce the incidence of timing errors therein comprises means for controlling a rate at which the set of input test vectors are provided to the IC.

29. The apparatus of claim 28 wherein the means for controlling the rate at which the set of input test vectors are provided to the IC comprises a digital IC tester or a computer-controlled switch matrix.

30. The apparatus of claim 23 wherein the substrate comprises silicon.

31. The apparatus of claim 23 wherein the photon energy of the laser beam is insufficient to produce a photocurrent in the IC.

32. The apparatus of claim 23 wherein the photon energy of the laser beam is at a wavelength in the range of 1.2 microns to 2.5 microns.

33. The apparatus of claim 32 wherein the wavelength is about 1.3 microns.

34. The apparatus of claim 23 further including an optical filter placed in a path of the laser beam to remove any light having a photon energy greater than or equal to the bandgap energy of the semiconductor substrate.

35. The apparatus of claim 23 wherein the scanning optical microscope comprises at least one lens or curved mirror for focusing the laser beam to a spot.

36. The apparatus of claim 35 wherein the laser beam is focused to a spot after being transmitted through the substrate.

37. The apparatus of claim 23 wherein the scanning optical microscope further includes a photodetector for detecting a portion of the laser beam reflected or scattered from the IC and generating a detector output signal therefrom.

38. The apparatus of claim 37 wherein the display further receives the detector output signal, and in combination with the position signal, the display generates a reflected-light image of the IC for superposition with the map to pinpoint the location of each signal propagation path within the IC responsible for producing the timing errors.

39. The apparatus of claim 23 wherein the means for measuring the output voltage from the IC and generating the analytical output signal comprises a latch which switches between a pair of logic states therein in response to a change in the output voltage from the IC from the incorrect value to the correct value, or from the correct value to the incorrect value.

40. The apparatus of claim 23 further including an image processor for accumulating a plurality of maps over time generated from the position signal and the analytical output signal, and generating therefrom an enhanced-resolution map for more precisely locating each signal propagation path within the IC responsible for producing the timing errors.

41. The apparatus of claim 23 further including a computer for storing information about the location of each signal propagation path producing the timing errors in the IC.

42. The apparatus of claim 23 wherein the signal propagation path that produces the timing errors comprises an interconnection having a resistance different from the resistance of other similar interconnections in the IC which do not produce timing errors.

43. The apparatus of claim 23 wherein the signal propagation path that produces the timing errors includes at least one switching transistor.

44. A method for analyzing an integrated circuit (IC) and identifying any circuit elements in the IC responsible for producing functional failures in the IC, comprising steps for:

(a) controlling operational parameters of the IC to induce a level of incidence of the functional failures therein, with the functional failures producing an incorrect value of an output voltage from the IC in response to a set of input test vectors provided to the IC;

(b) scanning the IC with a focused laser beam having a photon energy less than a bandgap energy of a substrate whereon the IC is formed to locally heat circuit elements within the IC, thereby changing the level of incidence of the functional failures in the IC; and (c) measuring the change in the level of incidence of the functional failures in the IC as a function of the position of the focused laser beam incident on the IC, thereby locating the circuit elements in the IC responsible for producing the functional failures in the IC.

45. The method of claim 44 further including a step for forming a map of the location of the circuit elements in the IC responsible for producing the functional failures in the IC.

46. The method of claim 45 further including a step for forming a reflected-light image of the IC for superposition with the map for precisely locating the circuit elements in the IC responsible for producing the functional failures in the IC.

47. The method of claim 46 wherein the step for forming the reflected-light image of the IC comprises detecting a portion of the focused laser beam reflected or scattered from the IC.

48. The method of claim 44 wherein the step for controlling operational parameters of the IC to induce the level of incidence of the functional failures therein comprises controlling a voltage for powering the IC, controlling the temperature of the IC, controlling a clock frequency provided to the IC, controlling a rate at which the set of input test vectors is provided to the IC, controlling a power level of the focused laser beam, or a combination thereof.

49. The method of claim 44 wherein the substrate comprises silicon, and the step for scanning the IC with the focused laser beam comprises scanning the IC with a focused laser beam having a wavelength in the range of 1.2 to 2.5 microns.

50. The method of claim 49 wherein the focused laser beam has a wavelength of about 1.3 microns.

51. The method of claim 44 wherein the step for scanning the IC with the focused laser beam comprises scanning the IC from a backside of a substrate whereon the IC is formed, with the focused laser beam being transmitted through the substrate.

52. The method of claim 44 wherein the step for scanning the IC with the focused laser beam further comprises generating a position signal for indicating the location of the focused laser beam on the IC at any instant in time.

53. The method of claim 44 wherein the step for measuring the change in the level of incidence of the functional failures in the IC as a function of the position of the focused laser beam incident on the IC comprises comparing the value of the output voltage from the IC at each clock cycle and detecting a change in the value of the output voltage from the IC.

54. The method of claim 53 further including a step for generating an analytical output signal having an intensity that depends upon the value of the output voltage from the IC, with the analytical output signal being in a first state when the output voltage from the IC has an incorrect value, and with the analytical output signal being in a second state when the output voltage from the IC has a correct value.

55. The method of claim 44 wherein the step for measuring the change in the level of incidence of the functional failures in the IC as a function of the position of the focused laser beam incident on the IC comprises repeatedly scanning the IC with the focused laser beam and accumulating changes in the level of incidence of the functional failures in the IC over time, thereby improving a level of detectability of the circuit elements in the IC responsible for producing the functional failures in the IC.

* * * * *